(12) United States Patent
Ishikawara et al.

(10) Patent No.: US 7,521,011 B2
(45) Date of Patent: Apr. 21, 2009

(54) SEMICONDUCTOR-SEALING-PURPOSE EPOXY RESIN COMPOUND PRODUCING METHOD

(75) Inventors: Mitsuo Ishikawara, Oyama (JP); Kouji Taya, Shimodate (JP); Rikiya Kobayashi, Shimodate (JP); Hideki Ebihara, Souwa-machi (JP); Tateo Yamada, Yuki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 717 days.

(21) Appl. No.: 10/526,008

(22) PCT Filed: Jan. 30, 2004

(86) PCT No.: PCT/JP2004/000945

§ 371 (c)(1),
(2), (4) Date: Feb. 25, 2005

(87) PCT Pub. No.: WO2004/067244

PCT Pub. Date: Aug. 12, 2004

(65) Prior Publication Data

US 2006/0017188 A1 Jan. 26, 2006

(30) Foreign Application Priority Data

Jan. 30, 2003 (JP) .............................. 2003-022571

(51) Int. Cl.
*B29C 47/38* (2006.01)
(52) U.S. Cl. .................... 264/211.21; 366/101; 366/107
(58) Field of Classification Search ............ 264/211.21; 257/780, 793, 794
See application file for complete search history.

(56) References Cited

U.S. PATENT DOCUMENTS 5,107,325 A * 4/1992 Nakayoshi .................. 257/793

(Continued)

FOREIGN PATENT DOCUMENTS

JP 06064021 A * 3/1994

(Continued)

OTHER PUBLICATIONS

International Search Report for International Application No. PCT/JP2004/000945, date of mailing May 25, 2004.

*Primary Examiner*—Joseph S. Del Sole
*Assistant Examiner*—David N Brown, II
(74) *Attorney, Agent, or Firm*—Antonelli, Terry, Stout & Kraus, LLP.

(57) ABSTRACT

A method of manufacturing an epoxy resin composition for semiconductor encapsulating by use of a kneader provided with a suction hole on the downstream side of a kneading region in a conveying direction of the epoxy resin composition, and being provided with a supply orifice and a discharge orifice respectively disposed on the upstream side and the downstream side in the conveying direction of the epoxy resin composition, the method comprising kneading the epoxy resin composition, while discharging a volatile gas from the kneader through the suction hole, and simultaneously introducing outside air to the kneader through the supply orifice and the discharge orifice. Even under conditions of continuous operation of the kneader, it is possible to efficiently discharge a volatile gas, thereby significantly decreasing the quantity of a volatile components remaining in the kneaded epoxy resin composition. Therefore, when semiconductor devices are encapsulated with the epoxy resin composition, the generation of voids can be decreased.

5 Claims, 1 Drawing Sheet

U.S. PATENT DOCUMENTS

| | | | |
|---|---|---|---|
| 5,117,279 A * | 5/1992 | Karpman | 257/793 |
| 5,132,778 A * | 7/1992 | Juskey et al. | 257/793 |
| 6,162,878 A * | 12/2000 | Osada et al. | 525/481 |
| 2002/0060373 A1 * | 5/2002 | Tanaka et al. | 257/792 |

FOREIGN PATENT DOCUMENTS

| | | |
|---|---|---|
| JP | 06-293021 | 10/1994 |
| JP | 06293021 A * | 10/1994 |
| JP | 07-314440 | 12/1995 |
| JP | 07314440 A * | 12/1995 |
| JP | 09-052228 | 2/1997 |
| JP | 09052228 A * | 2/1997 |
| JP | 11-170251 | 5/1999 |
| JP | 11-267483 | 10/1999 |
| JP | 2001-081284 | 3/2001 |

* cited by examiner

SEMICONDUCTOR-SEALING-PURPOSE EPOXY RESIN COMPOUND PRODUCING METHOD

BACKGROUND OF THE INVENTION

1. Field of the Invention

The present invention relates to a method of manufacturing an epoxy resin composition for semiconductor encapsulating, an epoxy resin composition for semiconductor encapsulating manufactured by the method, and a semiconductor device encapsulated with the epoxy resin composition for semiconductor encapsulating.

2. Description of the Related Art

In general, a resin composition for semiconductor encapsulating is comprised of an epoxy resin having excellent electrical properties, heat resistance and mass productivity, a curing agent for the epoxy resin, a catalyst, a release agent, a flame retardant, an additive such as a coloring agent, and a filler which occupies 70 to 95 wt % in terms of a composition ratio. Furthermore, its manufacturing method comprises the steps of blending and mixing predetermined amounts of components constituting the resin composition, kneading the mixture by the use of a mixing mill, a uniaxial kneader, a combination of the uniaxial kneader and the mixing mill, or a biaxial kneader, rolling the kneaded material into a sheet form, cooling the sheet, pulverizing the cooled sheet, and then, if necessary, forming the pulverized material into cylindrical tablets. In the kneading step of these steps, the biaxial kneader which is excellent in productivity has often been used as the kneader.

However, the biaxial kneader has a hermetically sealed inside structure, and hence, in a case where a gas is volatilized from the kneaded material, the volatile gas is discharged out of the kneader through a discharge orifice of the kneader. When the volatile gas contacts with a cooled member for the discharge orifice of the biaxial kneader, the volatile gas comes to be cooled and liquefied, and the resultant liquid then adheres to the member for the discharge orifice. Particularly, when the liquid adheres to a portion close to the discharge orifice of the kneader, there is a fear that the liquid mingles with the kneaded material or drops onto sheet forming rolls for cooling the kneaded material.

In such a case where the liquid mingles with the kneaded material, there is a fear that voids (pores) are generated during the molding of semiconductor packages. Furthermore, when the liquid adheres to the sheet forming rolls, there is also a fear that a trouble occurs during the operation of the kneader.

As means for solving the above problem, there has been disclosed a biaxial kneader characterized by the shape of a vent port to efficiently discharge a volatile gas (see Japanese Patent Application Laid-open No. 7-314440). Furthermore, a method for carrying out the kneading operation while maintaining the pressure in the kneader at a reduced pressure of 250 mmHg or lower has also been proposed (see Japanese Patent No. 3009027 and Japanese Patent No. 3320354).

In these methods, it is necessary to seal a kneading section of the kneader with a kneaded material to create the conditions of the reduced pressure. This is apt to cause the movement of the kneaded material toward a suction port, clogging of a discharge orifice and the like, which makes continuous production difficult.

Therefore, at the production site of a conventional epoxy resin composition for semiconductor encapsulating, prescribed maintenance such as removal of the resin composition adhering to a part of the kneader has been carried out in a case where the kneader is continuously operated.

In the meantime, in recent years, semiconductor packages are becoming increasingly thinner so that a material for semiconductor encapsulating is also decreasing in thickness in the package. The presence of the voids makes it difficult to secure desired moisture resistance reliability and electric insulation properties. For this reason, there has been a strong demand for a means for removing volatile components to prevent the generation of the voids.

Therefore, in order to solve such conventional problems, it is an object of the present invention to provide a method of manufacturing an epoxy resin composition for semiconductor encapsulating, by which a volatile gas can be efficiently discharged even under a condition of continuous kneading operation.

SUMMARY OF THE INVENTION

The present invention is directed to a method of manufacturing an epoxy resin composition for semiconductor encapsulating by use of a kneader, the kneader being provided with a suction hole on the downstream side of a kneading region in a conveying direction of the epoxy resin composition, and being provided with a supply orifice and a discharge orifice which are respectively disposed on the upstream side and the downstream side in the conveying direction of the epoxy resin composition, the method comprising the step of kneading the epoxy resin composition while discharging a volatile gas in the kneader out of the kneader through the suction hole, and simultaneously introducing outside air through the supply orifice and the discharge orifice into the kneader.

In the present invention, it is preferred that a quantity of the gas to be discharged from the kneader is in the range of 3 to 60 $m^3/h$, and the quantity of the outside air to be introduced through the supply orifice is in the range of 0.1 to 2 $m^3/h$.

Another aspect of the present invention is directed to an epoxy resin composition for semiconductor encapsulating manufactured by the method described above. In this case, it is preferred that the epoxy resin composition for semiconductor encapsulating comprises an epoxy resin, a curing agent for the epoxy resin, and an inorganic filler. Further, the quantity of the inorganic filler to be mixed is preferably in the range of 70 to 97 wt % based on the total weight of the composition.

Still another aspect of the present invention is directed to a semiconductor device encapsulated with the epoxy resin composition for semiconductor encapsulating described above.

Figure 1:
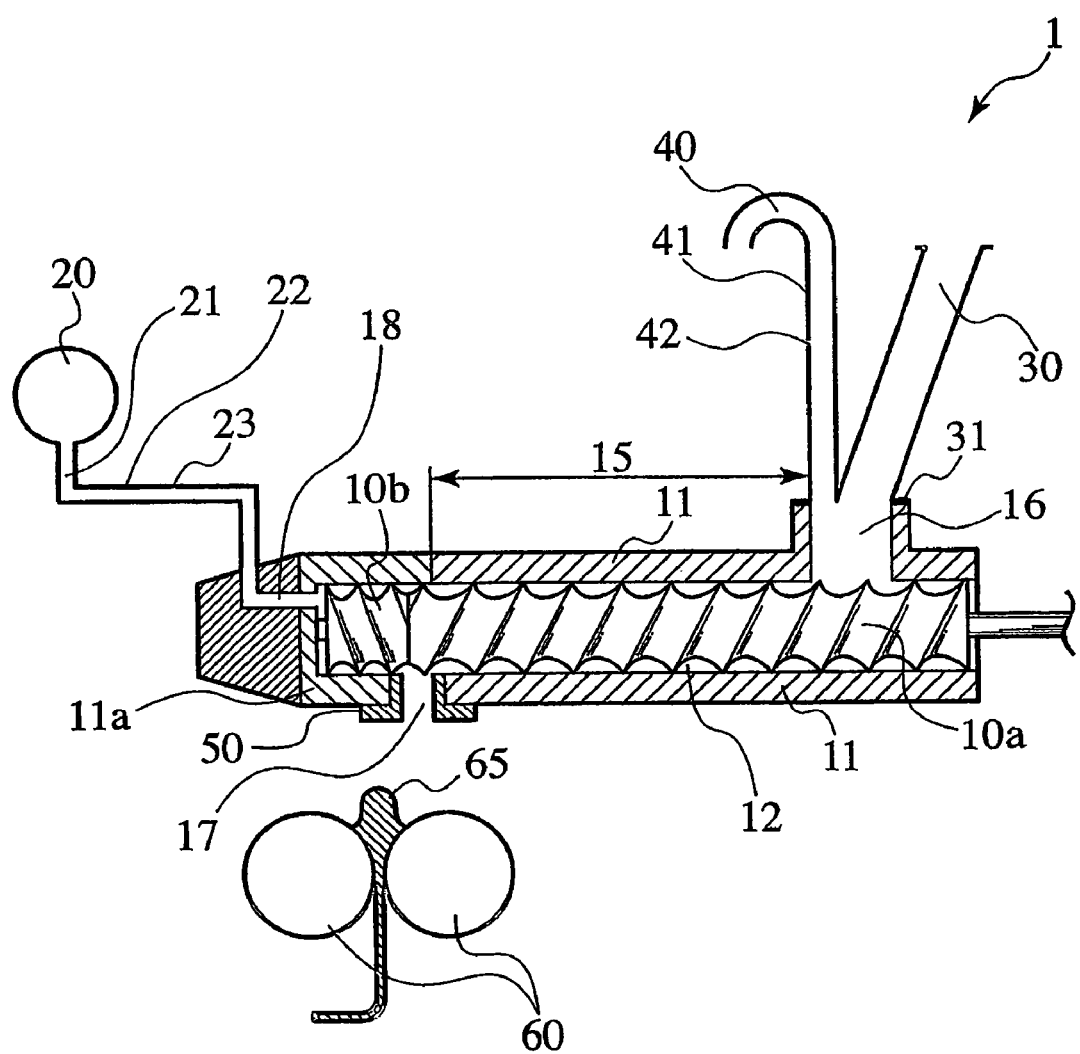
FIG. 1 is a sectional side view of a biaxial kneader to be used in the present invention.

| Description of Symbols | |
|---|---|
| 1: | biaxial kneader (kneader). |
| 10a: | axial member for conveying a kneaded material. |
| 10b: | axial member for reversing a kneaded material. |
| 11: | inner wall. |
| 11a: | inner wall on downstream side of kneading region. |
| 12: | kneading section. |
| 15: | kneading region. |
| 16: | supply orifice. |
| 17: | discharge orifice. |
| 18: | suction hole. |
| 20: | blower (suction means). |
| 21: | suction pipe. |
| 22: | straight part of suction pipe. |

-continued

| | Description of Symbols |
|---|---|
| 23: | hole for measuring quantity of sucked air. |
| 30: | shoot. |
| 31: | bottom end of shoot. |
| 40: | outside air introducing pipe. |
| 41: | straight part of the outside air introducing pipe. |
| 42: | hole for measuring air quantity at the supply orifice. |
| 50: | member for discharge orifice. |
| 60: | sheet forming rolls. |
| 65: | kneaded material. |

DESCRIPTION OF THE PREFERRED EMBODIMENTS

A description will be made with regard to the embodiments of the present invention. The epoxy resin composition for semiconductor encapsulating of the present invention contains an epoxy resin and a curing agent for the epoxy resin.

Preferably, the epoxy resin composition for semiconductor encapsulating further contains an inorganic filler in terms of lowering of a coefficient of linear expansion.

First, the epoxy resin to be used in the present invention will be described.

In the present invention, an epoxy resin commonly used for manufacturing an epoxy resin composition for semiconductor encapsulating can be used. Examples of such an epoxy resin include: a novolac type epoxy resin such as a phenol novolac type epoxy resin, an ortho-cresol novolac type epoxy resin, or an epoxy resin having a triphenylmethane skeleton, which is an epoxidized product of a novolac resin obtained by condensation or copolycondensation of phenols (e.g., phenol, cresol, xylenol, resorcin, catechol, bisphenol A, or bisphenol F) and/or naphthols (e.g., α-naphthol, β-naphthol, or dihydroxynaphthalene) and a compound having an aldehyde group (e.g., formaldehyde, acetaldehyde, propionaldehyde, benzaldehyde, or salicylaldehyde) under the presence of an acid catalyst; diglycidyl ether such as bisphenol A, bisphenol F, bisphenol S, or alkyl-substituted or non-substituted bisphenol; a stilbene type epoxy resin; a hydroquinone type epoxy resin; a glycidyl ester type epoxy resin obtained by the reaction of a polybasic acid (e.g., phthalic acid or dimer acid) and epichlorohydrin; a glycidyl amine type epoxy resin obtained by the reaction of polyamine (e.g., diaminodiphenylmethane or isocyanuric acid) and epichlorohydrin; an epoxidized product of a resin obtained by copolycondensation of dicyclopentadiene and phenols; a biphenyl type epoxy resin; an epoxy resin having a naphthalene ring; an epoxidized product of a naphthol-aralkyl resin; a trimethylolpropane type epoxy resin; a terpene modified epoxy resin; an aliphatic epoxy resin obtained by oxidation of olefin bonds with peracid such as peracetic acid; and a sulfur atom-containing epoxy resin. These epoxy resins can be used singly or in combination of two or more.

Further, as for the curing agent for the epoxy resin, a curing agent commonly used for manufacturing an epoxy resin composition for semiconductor encapsulating can be used. Examples of such a curing agent include: a novolac type phenol resin obtained by condensation or copolycondensation of phenols (e.g., phenol, cresol, resorcin, catechol, bisphenol A, bisphenol F, phenylphenol, or aminophenol) and/or naphthols (e.g., α-naphthol, β-naphthol, or dihydroxynaphthalene) and a compound having an aldehyde group (e.g., formaldehyde, benzaldehyde, or salicylaldehyde) under the presence of an acid catalyst; various polyhydric phenol compounds such as tris(hydroxyphenyl)methane or dihydroxybiphenyl; a phenol resin having a novolac structure containing a biphenyl derivative and/or a naphthalene derivative in a molecule; an aralkyl type phenol resin such as a phenol-aralkyl resin (e.g., a phenol compound represented by the following general formula (I):

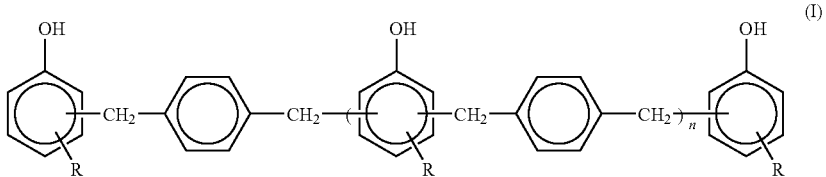

wherein R represents an alkyl group having 1 to 4 carbon atoms and n is an integer of 0 or more), a naphthol-aralkyl resin or a biphenyl-aralkyl resin; a dicyclopentadiene type phenol novolac resin synthesized by copolymerization of phenols and/or naphthols and cyclopentadiene; a dicyclopentadiene type phenol resin such as a naphthol novolac resin; a terpene modified phenol resin; an acid anhydride such as maleic anhydride, phthalic anhydride, or pyromellitic anhydride; and an aromatic amine such as methaphenylenediamine, diaminodiphenylmethane, or diaminodiphenylsulfone. These curing agents can be used singly or in combination of two or more. It is preferred that the curing agent is mixed with the epoxy resin so that the ratio of the number of epoxy groups in the epoxy resin to the number of hydroxyl groups in the curing agent lies in the range of 0.7 to 1.3.

The inorganic filler to be used in the present invention is not limited to any specific one. Examples of such an inorganic filler include: fused silica powder; crystalline silica powder; powder or spherical beads of alumina, zircon, calcium silicate, calcium carbonate, silicon carbide, aluminum nitride, boron nitride, beryllia, or zirconia; monocrystalline fibers of potassium titanate, silicon carbide, silicon nitride, or alumina; and glass fibers. These inorganic fillers can be used singly or in combination of two or more. Further, as for an inorganic filler having a flame-retardant effect, aluminum hydroxide, magnesium hydroxide, or zinc borate can be mentioned, and they can be used singly or in combination of two or more. In this regard, it is to be noted that the quantity of the inorganic filler to be mixed is preferably 70 to 97 wt %, more preferably 80 to 95 wt %, based on the total weight of the composition in terms of hygroscopic properties and lowering of a coefficient of linear expansion.

Further, as necessary, the epoxy resin composition of the present invention may contain a curing accelerator. Examples of the curing accelerator include: imidazole compounds such as 2-methylimidazole, 2,4-dimethylimidazole, 2-ethyl-4-methylimidazole, 2-phenylimidazole, 2-phenyl-4-methylimidazole, and 2-heptadecylimidazole; tertiary amine compounds such as triethylamine, benzyldimethylamine, α-methylbenzyldimethylamine, 2-(dimethylaminomethyl)phenol, 2,4,6-tris(dimethylaminomethyl)phenol, and 1,8-diazabicyclo(5,4,0)undecene-7; organometallic compounds such as zirconium tetramethoxide, zirconium tetrapropoxide, tetrakis(acetylacetonato)zirconium, and tri(acetylacetonato)aluminum; and organic phosphine compounds such as triphenylphosphine, trimethylphosphine, triethylphosphine, tributylphosphine, tri(p-methylphenyl)phosphine, and tri(nonylphenyl)phosphine.

Furthermore, if necessary, the epoxy resin composition of the present invention may contain a flame retardant. Examples of the flame retardant include: brominated epoxy resins such as brominated bisphenol A type epoxy resins and brominated phenol novolac type epoxy resins; brominated polycarbonate resins; brominated polystyrene resins; brominated polyphenyleneoxide resins; tetrabromobisphenol A; and decabromodiphenyl ether. Also, as for a non-halogen or non-antimony flame retardant, red phosphorus, red phosphorus coated with an inorganic compound such as zinc oxide and a thermosetting resin such as phenol resin, a phosphorus compound (e.g., phosphoric ester), a nitrogen-containing compound (e.g., melamine, a melamine derivative, a melamine modified phenol resin, a compound having a triazine ring, a cyanuric acid derivative or an isocyanuric acid derivative), a compound containing phosphorus and nitrogen (e.g., cyclophosphazene), or a compound containing a metallic element (e.g., aluminum hydroxide, magnesium hydroxide, zinc oxide, zinc stannate, zinc borate, iron oxide, molybdenum trioxide, zinc molybdate, or dicyclopentadienyl iron) can be mentioned, for example. These flame retardants can be used singly or in combination of two or more.

Moreover, as necessary, the epoxy resin composition of the present invention may contain a coupling agent such as epoxysilane, aminosilane, or mercaptosilane.

Moreover, as necessary, the epoxy resin composition of the present invention may contain various additives such as a releasing agent, a coloring agent, a silicone-based stress relaxation agent, and an ion trap agent.

A manufacturing method of the epoxy resin composition of the present invention comprises the steps of blending predetermined amounts of components as described above, and pre-mixing and pre-kneading if necessary, kneading the mixture by kneader, rolling the kneaded material, cooling, pulverizing the cooled sheet, and then, if necessary, forming the pulverized material into tablets.

Next, a description will be made with regard to a kneader to be used in the present invention. FIG. 1 is a schematic illustration which shows a sectional side view of a biaxial kneader 1 that is one embodiment of the kneader to be used in the present invention.

In the kneader to be used in the present invention, a suction hole 18 is provided on the downstream side of a kneading region 15 of the kneader in a conveying direction of the kneaded material. Specifically, the suction hole 18 is provided in an inner wall 11a on the downstream side of the kneading region.

As shown in FIG. 1, the suction hole 18 is preferably disposed in the end surface of the inner wall 11a on the downstream side.

Further, as for axial members in a kneading section of the kneader, it is preferred that an axial member 10a for conveying a kneaded material is provided on the upstream side and an axial member 10b for reversing the kneaded material is provided on the downstream side of the kneading region 15. That is, it is preferred that the axial member 10b, by which the conveying direction of the kneaded material is reversed to discharge the kneaded material through an discharge orifice 17, is provided at a portion adjacent to the axial member 10a for conveying the kneaded material on the downstream side in the conveying direction, that is, on the downstream side of the discharge orifice 17 of the kneader.

Furthermore, the suction hole is preferably connected to a blower 20 as a suction means.

In this regard, it is to be noted that, in the present invention, the kneaded material means a general term of the epoxy resin composition components un-melted in the kneader and the epoxy resin composition melted and kneaded in the kneading section.

It is also to be noted that the kneading region 15 means a region from the downstream side of a supply orifice 16 in the conveying direction to the upstream side of the discharge orifice 17 in the conveying direction, which is indicated by the arrow in FIG. 1. The kneading region, the range in FIG. 1., does not limit a kneading range, and means containing the kneading section 12.

Further, the inner wall 11a on the downstream side (on the left side in FIG. 1) of the kneading region refers to a semi-cylindrical part of the inner wall 11, which contains the end surface on the downstream side.

As shown in FIG. 1, the biaxial kneader 1 to be used in the present invention is mainly comprised of the axial member 10a for conveying the kneaded material and the axial member 10b for reversing the kneaded material, the inner wall 11 provided around the axial members 10a and 10b, the kneading section 12 which is a space formed between the axial members 10a and 10b and the inner wall 11, and the blower 20 which is a suction means connected to the suction hole 18 provided on the downstream side of the kneading region in the conveying direction of the kneaded material. Further, the supply orifice 16 and the discharge orifice 17 are respectively disposed on the upstream side and the downstream side in the conveying direction of the kneaded material.

The supply orifice 16 of the kneader is provided with a shoot 30 which serves as a guide for supplying the epoxy resin composition components, and the supply orifice 16 is connected to a bottom end 31 of the shoot 30 via screws or the like (not shown). Further, an outside air introducing pipe 40 is attached to the bottom end 31 of the shoot.

The shape or form of the outside air introducing pipe 40 is not particularly limited. That is, measures directed toward the prevention of entry of foreign substances, such as setting of a filter (not shown) in the midway between outside air side opening and supply orifice side opening of the tip end of the outside air introducing pipe 40, or setting of a filter in the tip end of the outside air introducing pipe 40, or bending of the tip end to direct in a downward direction can be taken. The outside air introducing pipe 40 may be attached at a position shown in FIG. 1, but it may also be attached at any position in the supply orifice of the kneader or at any position on the upstream side of the bottom end 31 of the shoot, as long as it is attached on the downstream side of an outlet of a resin composition components supplying machine.

The discharge orifice 17 is provided with a member for discharge orifice 50 in which cooling water is flown for preventing adhesion of the kneaded material.

Further, sheet forming rolls 60 for rolling the kneaded material 65 are provided in proximity to the discharge orifice 17, if desired.

In the kneader 1, the kneading section 12 is formed by providing the inner wall 11 around the axial members 10a and 10b. For the purpose of discharging a volatile gas in the kneading section 12 out of the kneader, the blower 20 as a suction means is provided on the downstream side of the kneading region 15 (shown by the arrow in FIG. 1) of the kneader in the conveying direction of the kneaded material. Preferably, such a blower 20 is provided via the suction hole 18 disposed in the end surface on the downstream side of the kneader.

With such a structure, it is possible to knead while efficiently discharging a volatile gas in the kneading section out of the kneader through the suction hole 18 by actuating the suction means. Such operation is carried out Simultaneously while introducing outside air into the kneading section through the supply orifice and the discharge orifice of the kneader. Outside air is also introduced through the supply orifice intermittently due to the change of the inside of the kneader.

At this time, it is preferred that the quantity of sucked air out of the kneader is in the range of 3 to 60 $m^3/h$, and outside air is introduced so that the quantity of outside air to be introduced through the supply orifice (herein below, referred to as the air quantity at the supply orifice) is in the range of 0.1 to 2 $m^3/h$. More preferably, the quantity of sucked air is in the range of 6 to 30 $m^3/h$, and the air quantity at the supply orifice is in the range of 0.25 to 1.2 $m^3/h$. If the quantity of sucked air is less than 3 $m^3/h$ or the air quantity at the supply orifice is less than 0.1 $m^3/h$, there is a tendency that the effect of reducing the quantity of the voids or the frequency of occurrence of trouble that the kneaded material adheres to the sheet forming rolls is lowered. On the other hand, even if the quantity of sucked air exceeds 60 $m^3/h$ or the air quantity at the supply orifice exceeds 2 $m^3/h$, there is no difference in effectiveness. Further, sucking of such a large quantity of air is not preferable because there is a possibility that another trouble such as clogging of the suction hole 18 due to excessive suction occurs.

Here, the quantity of sucked air means the quantity of air to be sucked through the suction hole 18, and the air quantity at the supply orifice means the quantity of air to be introduced through the supply orifice 16. For example, in FIG. 1, the quantity of sucked air means the quantity of gas to be discharged through the suction hole 18 by blower 20, and the air quantity at the supply orifice means the quantity of air to be introduced through a straight part 41 of the outside air introducing pipe 40 (having a diameter of 50 mm, for example) of the supply orifice 16.

For example, the quantity of sucked air and the air quantity at the supply orifice are measured in the following manner. A hole 42 for measuring the air quantity at the supply orifice is bored in a straight part 41 of the outside air introducing pipe 40, and an air velocity at the hole 42 is measured by an anemometer. Then, the measured air velocity is multiplied by a cross-sectional area of the outside air introducing pipe 40 to determine the air quantity at the supply orifice. Furthermore, a hole 23 for measuring the quantity of sucked air is bored in a straight part 22 of a suction pipe 21, and an air velocity is measured by the above anemometer. Then, the measured air velocity is multiplied by the cross-sectional area of the suction pipe 21 to determine the quantity of sucked air.

Outside air is not particularly limited, and an atmosphere in which operators can normally work can be employed. Preferably, an atmosphere having a temperature of 30° C. or lower and a relative humidity of 60% or lower is employed, and more preferably, an atmosphere having a temperature of 20° C. or lower and a relative humidity of 40% or lower is employed. Further, air having a low dew point may be introduced through the outside air introducing pipe 40 for the purpose of facilitating volatilization as mush as possible.

In the present invention, by introducing outside air positively into the kneader not only through the discharge orifice 17 but also through the opening of the outside air introducing pipe 40 of supply orifice 16 while kneading, the saturation of the volatile gas comes to be reduced and volatilization can be promoted. Therefore, the quantity of a volatile components remaining in the kneaded material is significantly decreased so that the quantity of a volatile gas to be discharged through the discharge orifice is also decreased. As a result, it is possible to prevent a phenomenon that a liquid generated by the liquefaction of volatile gas adheres to the sheet forming rolls is prevented. That is, the voids (pores) are hard to be generated when semiconductor packages are molded. Further, the prevention of adhesion of the above liquid to the sheet forming rolls increases the reliability of the kneader.

The kneader to be used in the present invention is not particularly limited as long as it can knead an epoxy resin composition for semiconductor encapsulating and can be provided with a suction means. Therefore, a known conventional kneader can be used by providing a suction means. Preferably, a continuous kneader in which an axial member is covered with a drum body, such as a uniaxial kneader or a biaxial kneader is used in the present invention. In particular, among these kneaders, a biaxial kneader is preferably used in terms of production efficiency. Such a kneader is commercially available, and as for an example of the kneader, "KRC Kneader" manufactured by KURIMOTO, Ltd. can be mentioned.

The suction means 20 to be used in the present invention is not limited to any specific one as long as it can discharge a volatile gas in the kneading section out of the kneader. Specifically, a suction means which has a capability of sucking a volatile gas in the kneader at 60 $m^3/h$ or more is preferable. For example, a blower or a vacuum pump commercially available can be used as such a suction means. Among them, a blower (e.g., "HSB Model" manufactured by SHOWA DENKI CO LTD) is preferable as the suction means since a blower can suck a large quantity of air as compared with a vacuum suction means such as a vacuum pump.

The above suction means is disposed via the suction hole 18 provided at a predetermined position of the kneader. Here, the suction hole is provided on the downstream side of the kneading region of the kneader in the conveying direction of the kneaded material. By providing the suction hole in such a manner, it is possible to efficiently discharge a volatile gas out of the kneader. Preferably, the suction hole is provided in an end surface on the downstream side of the kneader as shown in FIG. 1. This is advantageous in that the kneaded material does not reach the suction hole.

Another aspect of the present invention is to provide an epoxy resin composition for semiconductor encapsulating obtained by the manufacturing method according to the present invention. Preferably, there is provided an epoxy resin composition for semiconductor encapsulating containing the inorganic filler in an amount of 70 wt % or more but 97 wt % or less based on the total weight of the composition. Moreover, the epoxy resin composition for semiconductor encapsulating obtained by the manufacturing method according to the present invention is excellent in mold ability, and hence, still another aspect of the present invention is to provide a semiconductor device encapsulated with the epoxy resin composition for semiconductor encapsulating.

Such semiconductor devices of the invention include, for example, resin encapsulating type IC such as DIP (dual inline package), PLCC (plastic leaded chip carrier), QFP (quad flat package), SOP (small outline package), SOJ (small outline J-lead package), TSOP (thin small outline package), TQFP (thin quad flat package) etc., produced by fixing an element such as semiconductor chip on a lead frame (island tab), connecting a terminal (e.g. a bonding pad) of the element to the lead by wire bonding or bumping, and then encapsulating the semiconductor chip by transfer molding with the epoxy resin composition for semiconductor encapsulating of the invention; TCP (tape carrier package) wherein a semiconductor chip lead-bonded onto a tape carrier was encapsulated with the epoxy resin composition for semiconductor encapsulating of the invention; COB (chip on board) wherein a semiconductor chip connected by wire bonding, flip chip bonding or a solder to a wire formed on a circuit board or glass was encapsulated with the epoxy resin composition for semiconductor encapsulating of the invention; a semiconductor device such as COG (chip on glass) having a bare chip mounted thereon; hybrid IC wherein an active element such as semiconductor chip, transistor, diode, thyristor etc. and/or a passive element such as capacitor, resistance element, coil etc., connected by wire bonding, flip chip bonding, a solder etc. to a wire formed on a circuit board or glass, was encapsulated with the epoxy resin composition for semiconductor encapsulating of the invention; BGA (ball grid array) produced by installing a semiconductor chip on an interposer substrate having a terminal for connection to a multi chip module mother board, then connecting the semiconductor chip by bumping or wire bonding to a wire formed on the interposer substrate and then encapsulating the semiconductor-installed side with the epoxy resin composition for semiconductor encapsulating of the invention; CSP (chip size package); MCP (multi chip Package) etc.

The most general method of encapsulating a semiconductor device with the epoxy resin composition for encapsulating of the invention is low-pressure transfer molding, but injection molding, compression molding etc. can also be mentioned.

EXAMPLES

Herein below, the present invention will be concretely described with reference to examples and a comparative example. It goes without saying that the present invention is not limited to the following examples.

Examples 1 to 4 and Comparative Example (1) Preparation of Epoxy Resin Composition The following components were mixed:

4.3 parts by weight of a biphenyl type epoxy resin (manufactured by Japan Epoxy Resin Co., Ltd. under the trade name of "YX-4000H") having an epoxy equivalent of 196 and a melting point of 106° C., 0.8 part by weight of a bisphenol A type brominated epoxy resin containing 48 wt % of bromine and having an epoxy equivalent of 75 and a softening point of 80° C. (manufactured by Sumitomo Chemical Co., Ltd. under the trade name of "ESB-400T"), 4.8 parts by weight of a phenol novolac resin (manufactured by Meiwa Plastic Industries, Ltd. under the trade name of "H-1") having a softening point of 80° C., 0.2 part by weight of triphenylphosphine, 88 parts by weight of spherical fused silica having an average particle diameter of 17.5 μm and a specific area of 3.8 $m^2/g$, 0.3 part by weight of antimony trioxide, 0.2 part by weight of montanic acid ester (manufactured by Clariant K.K.), 0.2 part by weight of carbon black (manufactured by Mitsubishi Chemical Corporation under the trade name of "MA-100"), and 0.5 part by weight of γ-glycidoxypropyltrimethoxysilane (epoxysilane coupling agent).

The mixture was pre-kneaded (dry blending), and was then kneaded using a biaxial kneader in a manner described in the following (2) to obtain an epoxy resin composition for semiconductor encapsulating.

(2) Kneading Test

A kneading test was carried out using the biaxial kneader equipped with suction means as shown in FIG. 1. In Examples 1 to 4, the mixture was kneaded while carrying out suction, and on the other hand, in Comparative Example, the mixture was kneaded without carrying out the suction. It was observed whether or not a liquid produced by liquefaction of a volatile gas dropped onto sheet forming rolls, and adhesion troubles of the kneaded material to the sheet forming rolls were counted. In addition, there were evaluated voids which were generated in molding the kneaded material into packages.

The quantity of sucked air and the air quantity at the supply orifice were measured in the following manner. A hole 42 for measuring the air quantity at the supply orifice was bored in a straight part 41 of an outside air introducing pipe 40 (diameter: 50 mm) of the supply orifice 16, and an air velocity at the hole 42 was measured by an anemometer for very low velocities ("MODEL ISA-67" manufactured by Sibata Scientific Technology Ltd.). Then, the measured air velocity was multiplied by a cross-sectional area of the outside air introducing pipe 40 to determine the air quantity at the supply orifice. Furthermore, a hole 23 for measuring the quantity of sucked air was bored in a straight part 22 (diameter: 120 mm) of a suction pipe 21, and an air velocity was measured by the above anemometer. Then, the measured air velocity was multiplied by the cross-sectional area of the suction pipe 21 to determine the quantity of sucked air.

The number of occurred troubles was determined as an average value of the number of the troubles which occurred during continuously kneading 1 ton of the epoxy resin composition for semiconductor encapsulating. For the evaluation of the voids, the obtained epoxy resin composition for semiconductor encapsulating was molded into QFP packages each having a size of 14×20 mm under conditions of 180° C. and 6.9 MPa, and the surface of each of the molded packages was observed through a stereoscopic microscope to determine a ratio of the packages in which a pinhole having a diameter of 0.1 mm or more but less than 0.5 mm was included.

Test conditions and test results are shown in Table 1.

TABLE 1

| | Quantity of sucked air ($m^3/h$) | Air quantity at supply orifice ($m^3/h$) | Presence or absence of liquefaction |
|---|---|---|---|
| Example 1 | 3 | 0.15 | Absent |
| Example 2 | 6 | 0.25 | Absent |
| Example 3 | 30 | 1.2 | Absent |
| Example 4 | 60 | 2 | Absent |
| Comparative Example | None | None | Present |

TABLE 1-continued

| | Number of occurred troubles (number/ton) | Quantity of voids (ppm) | Number of clogging of suction hole (number/ton) |
|---|---|---|---|
| Example 1 | 0.3 | 2,400 | 0.0 |
| Example 2 | 0.2 | 2,400 | 0.0 |
| Example 3 | 0.03 | 300 | 0.0 |
| Example 4 | 0.02 | 200 | 0.01 |
| Comparative Example | 1.1 | 5,300 | — |

In Examples 1 to 4, it was confirmed that volatile gas in the kneader did not liquefy and the quantity of the voids was significantly decreased. Furthermore, it was also confirmed that the number of the occurred troubles of the sheet forming rolls were significantly decreased.

On the other hand, in Comparative Example regarding a conventional technique, it was confirmed that the liquefaction of the volatile gas occurred and a large amount of the voids was generated. Furthermore, it was also confirmed that a large number of the troubles of the sheet forming rolls occurred.

As described above, according to the present invention, it is possible to decrease the quantity of the voids generated in molding the semiconductor packages, and in addition, the reliability of the semiconductor device can also be improved. Therefore, the high quality epoxy resin composition for semiconductor encapsulating can be manufactured with a high productivity.

(3) Continuous Operation Test

A continuous operation test of the kneader was carried out for confirming reliability and stability as the kneader to be used in the present invention. As a result, it was possible to continuously operate the kneader used in the present invention for 80 hours or longer under all of the conditions in Examples 1 to 4. Furthermore, the quantity of the voids, which were generated in a resin composition obtained by continuously operating the kneader for 120 hours under the conditions of Examples 1 to 4, was evaluated in the same manner as described above. As a result, good results were obtained similarly to the test results of Examples 1 to 4.

Therefore, according to the kneader for the epoxy resin composition for semiconductor encapsulating in the present invention, it was confirmed that the good epoxy resin composition for semiconductor encapsulating can be obtained and in addition the stability of the kneader can be improved.

As described above, the present invention is not limited to the examples described above. Therefore, a uniaxial kneader can also be used instead of the biaxial kneader used in the examples.

INDUSTRIAL APPLICABILITY

In the present invention, since the kneader has a constitution which enables a volatile gas to be efficiently discharged even under conditions of continuous operation, the quantity of the volatile components remaining in the kneaded epoxy resin composition is significantly decreased, thereby decreasing the quantity of the volatile gas to be discharged through a discharge orifice. As a result, it is possible to prevent a phenomenon that a liquid produced by the liquefaction of the volatile gas adheres to the sheet forming rolls. Therefore, the epoxy resin composition for semiconductor encapsulating which enables the quantity of voids to be decreased at the time of encapsulating a semiconductor device can be manufactured with high productivity.

What is claimed is:

1. A method of manufacturing an epoxy resin composition for semiconductor encapsulating by use of a kneader provided with a suction hole on the downstream side of a kneading region in a conveying direction of the epoxy resin composition, and being provided with a supply orifice and a discharge orifice respectively disposed on the upstream side and the downstream side in the conveying direction of the epoxy resin composition, wherein the kneading region is from the downstream side of the supply orifice to the upstream side of the discharge orifice, the method comprising:

kneading the epoxy resin composition, while discharging a volatile gas in the kneader out of the kneader through the suction hole, and simultaneously introducing outside air to the kneader through the supply orifice and the discharge orifice.

2. The method of manufacturing the epoxy resin composition for semiconductor encapsulating according to claim 1, wherein a quantity of the gas to be discharged from the kneader is in the range of 3 to 60 m$^3$/h, and the quantity of the outside air to be introduced through the supply orifice is in the range of 0.1 to 2 m$^3$/h.

3. The method of manufacturing the epoxy resin composition for semiconductor encapsulating according to claim 1, wherein the kneader further includes suction means connected to the suction hole, for discharging the volatile gas in the kneader out of the kneader through the suction hole, while simultaneously introducing outside air to the kneader through the supply orifice and the discharge orifice, and wherein in said method said volatile gas is discharged through the suction hole while simultaneously introducing outside air through the supply orifice and the discharge orifice, by operation of the suction means.

4. The method of manufacturing the epoxy resin composition for semiconductor encapsulating according to claim 1, wherein the kneader includes a first axial member conveying the kneaded material in the kneading region and a second axial member conveying the kneaded material in a reverse direction to the conveying direction at a downstream side of the discharge orifice in the conveying direction.

5. The method of manufacturing the epoxy resin composition for semiconductor encapsulating according to claim 1, wherein the kneader includes a wall member surrounding the kneading region and a region downstream of the kneading region, in the conveying direction, said wall member including an end wall at an end of said region downstream of the kneading region in the conveying direction, and the suction hole is provided in the end wall.

* * * * *